United States Patent [19]

Enloe

[11] Patent Number: 4,957,771
[45] Date of Patent: Sep. 18, 1990

[54] ION BOMBARDMENT OF INSULATOR SURFACES

[75] Inventor: Carl L. Enloe, Bedford, Mass.

[73] Assignee: The United States of America as represented by the Secretary of the Air Force, Washington, D.C.

[21] Appl. No.: 384,192

[22] Filed: Jul. 21, 1989

[51] Int. Cl.$^5$ .............................................. B05D 3/06
[52] U.S. Cl. ....................................... 427/38; 427/69;
427/124; 427/125; 427/383.5; 427/383.9;
427/272.2
[58] Field of Search .................... 427/38, 69, 124, 125,
427/272.2, 383.5, 383.9

[56] References Cited

U.S. PATENT DOCUMENTS

| | | | |
|---|---|---|---|
| 3,972,059 | 7/1976 | DiStefano | 357/6 |
| 4,001,049 | 1/1977 | Baglin et al. | 148/1.5 |
| 4,065,780 | 12/1977 | Ballantyne | 357/6 |
| 4,104,693 | 8/1978 | Toda et al. | 361/120 |
| 4,161,814 | 7/1979 | Ballantyne | 29/580 |
| 4,256,780 | 3/1981 | Gaerttner et al. | 427/38 |
| 4,372,646 | 2/1983 | Strahan et al. | 350/96.31 |
| 4,416,724 | 11/1983 | Fischer | 156/628 |
| 4,466,839 | 8/1984 | Dathe et al. | 148/1.5 |
| 4,639,385 | 1/1987 | Jolitz et al. | 427/386 |
| 4,652,753 | 3/1987 | Shiokawa | 250/281 |

OTHER PUBLICATIONS

Technical Article from the Soviet Union by B. B. Ilin, A. S. Kleymenov and A. F. Perveyev, Entitled "Ion Bombardment of Insulators and Its Application in Optical Technology", which was published in the Soviet Journal of Optical Technology, vol. 39, No. 12 in 1972.

Primary Examiner—Bernard Pianalto
Attorney, Agent, or Firm—William G. Auton; Donald J. Singer

[57] ABSTRACT

A system is disclosed which will improve the flashover strength of high-voltage insulators in vacuum. Treatments which deposit a small amount of metal on an insulator surface can improve flashover performance. This process applies commercial ion-implantation techniques to achieve a quasi-metalized surface on a vacuum insulator. By making the metal a part of the structure of the insulator near the surface, the ion-bombardment process yields a surface which has the same electrical properties as a metalized surface achieved by other methods, with the additional advantage of mechanical and electrical ruggedness.

15 Claims, 1 Drawing Sheet

ION BOMBARDMENT OF INSULATOR SURFACES

STATEMENT OF GOVERNMENT INTEREST

The invention described herein may be manufactured and used by or for the Government for governmental purposes without the payment of any royalty thereon.

BACKGROUND OF THE INVENTION

The present invention relates generally to systems for fabricating high-voltage insulators, and more specifically to a method of improving the flashover strength of high-voltage insulators in vacuum.

High-voltage insulators in vacuum are prone to breakdown across surfaces (flashover) at voltages which are much lower than are required to cause breakdown through the material itself. The task of improving the flashover strength of high-voltage insulators is alleviated, to some extent, by the systems described in the following U.S. Patents, the disclosures of which are specifically incorporated herein by reference:

U.S. Pat. No. 3,972,059 issued to DiStefano;
U.S. Pat. No. 4,065,780 issued to Ballantyne;
U.S. Pat. No. 4,104,693 issued to Toda et al;
U.S. Pat. No. 4,161,814 issued to Ballantyne;
U.S. Pat. No. 4,652,753 issued to Shiokawa;
U.S. Pat. No. 4,256,780 issued to Gaerttner et al; and
U.S. Pat. No. 4,372,646 issued to Strahan et al.

The above-cited references, especially that of Gaerttner et al, recognize that treatments which deposit a small amount of metal on these surfaces, whether fired in place (as on a ceramic insulator) or vacuum deposited (as on a polymeric insulator) improve flashover performance: that is, the voltage at which flashover occurs increases. Techniques for depositing small amounts of metal on ceramic insulators are high temperature processes and are therefore unsuitable for treatment of polymeric materials. Vapor deposition of metal onto polymeric insulator materials generally results in a surface coating susceptible to mechanical damage and to damage from tracking if flashover occurs.

The improvement in flashover performance represents an ongoing need wherever it is necessary to operate with high voltage in a vacuum environment, and may be applied to spacecraft systems, particle-beam accelerators, and other types of research equipment. The present invention is intended to provide a technical advance to help satisfy that need.

SUMMARY OF THE INVENTION

The purpose of this invention is to improve the flashover strength of high-voltage insulators in vacuum. Treatments which deposit a small amount of metal on an insulator surface can improve flashover performance. This process applies commercial ion-implantation techniques to achieve a quasi-metalized surface on a vacuum insulator. By making the metal a part of the structure of the insulator near the surface, the ion bombardment process yields a surface which has the same electrical properties as a metalized surface achieved by other methods, with the additional advantage of mechanical and electrical ruggedness.

One embodiment of the invention is a process which applies commercial ion-implantation techniques to achieve a quasi-metalized surface on a vacuum insulator. The surface of the material is exposed to a beam of high-energy metal ions from a commercially-available accelerator. The energy of the incident ions determines the penetration depth, while the time the material is exposed to the beam determines the concentration of metal atoms per unit area near the surface. Penetration depths of up to 100 atomic diameters may be achieved, as may concentrations of up to $5 \times 10^{17}$ particles/cm$^2$. Using a high-current accelerator with a current of up to 100 microamperes (equivalent to a particle flux of approximately $5 \times 10^{14}$ particles/second), even this maximum concentration may be achieved by an exposure time on the order of a few minutes per square centimeter of insulator surface.

The present invention provides a method for improving the ability of high voltage insulator operating in vacuum to resist flashover. In the practice of the invention, a stream of metallic ions energized across high voltage is directed onto the insulator surface to form a quasi-metallized surface of selected ion density and depth of penetration at the material surface. Metallic ion penetration into the structure of the insulator material results in a surface displaying desirable electrical properties and good mechanical and electrical ruggedness. The invention may be used with various insulator materials but is especially useful on polymeric materials. Polymers have superior mechanical properties and are available in large sizes and are therefore desirable materials for practical insulator applications. The invention is useful wherever an insulator must operate at high voltage in vacuum, such as in spacecraft systems, particle beam accelerators and vacuum research equipment.

It is a principal object of the present invention to improve the flashover strength of high-voltage insulators.

It is another object of the present invention to use commercial ion-implantation techniques to provide improved high-voltage insulators.

These objects together with other objects, features and advantages of the invention will become more readily apparent from the following detailed description when taken in conjunction with the accompanying drawing wherein like elements are given like reference numerals throughout.

DETAILED DESCRIPTION OF THE PREFERRED EMBODIMENT

The present invention includes a process for improving the flashover strength of high-voltage insulators in which the surface of the material is exposed to a beam of high-energy metal ions from a commercially-available accelerator.

Ion bombardment of solids has been investigated for more than 100 years. Its wide application, however, only began in the 1950's. Now ion bombardment of metals and semiconductors is used is used to produce surfaces of ideal cleanliness, apply patterns to a surface, to inject ions into a surface layer, to produce thin films of different substances, in hetero-ion pumps, etc. In optical technology ion bombardment has only been used for the deposition of thin-layer coatings (cathode sputtering). In surface finishing of insulators, ion bombardment creates several problems, associated primarily with the generation of a charge on the insulator surface. Techniques for the ion bombardment of insulators have been developed in the last several years, so that it has become possible to use it for finishing the surface of components made of the traditional optical materials (glass, crystals).

The present invention includes a process which applies commercial ion-implantation techniques to achieve a quasi-metalized surface on a vacuum insulator. The surface of the material is exposed to a beam of high-energy metal ions from a commercially-available accelerator. The energy of the incident ions determines the penetration depth, while the time the material is exposed to the beam determines the concentration of metal atoms per unit area near the surface. Penetration depths of up to 100 atomic diameters may be achieved, as may concentrations of up to $5 \times 10^{17}$ particles/cm$^2$. Using a high-current accelerator with a current of up to 100 microamperes (equivalent to a particle flux of approximately $5 \times 10^{14}$ particles/second), even this maximum concentration may be achieved by an exposure time on the order of a few minutes per square centimeter of insulator surface.

Nearly all of the above-cited patents make use of ion-implantation in the treatment and doping of semiconductor substrates and metallic ohmic contacts. Ion-bombardment of insulators does not appear to be a common practice in the United States. The above-cited Strahan et al patent mentions a technical article from the Soviet Union by B.B. Ilin, A.S. Kleymenov and A.F. Perveyev entitled "Ion Bombardment of Insulators and Its Application in Optical Technology" which was published in the Soviet Journal of Optical Technology, Vol. 39 No. 12 in 1972. This article teaches the fundamentals of insulator sputtering by ion bombardment and possible applications of this method for finishing the surface of optical materials. A portion of the information from this article will be repeated in the description of the present invention, as described below.

Figure 1:
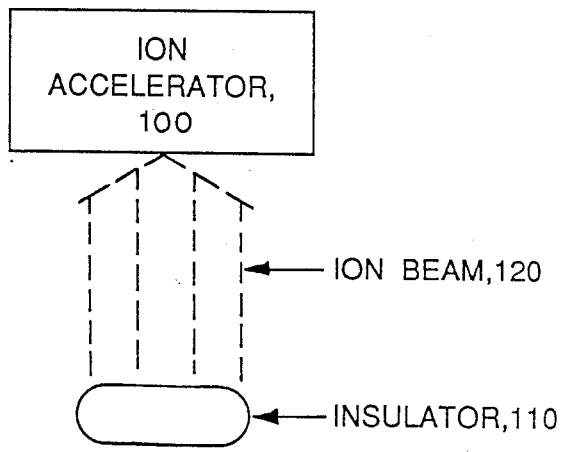
FIG. 1 is an illustration of the mechanical components use to accomplish the present invention.

The reader's attention is now directed towards FIG. 1, which is an illustration of the mechanical components necessary to operate the present invention. As mentioned above, high-voltage insulators used in a vacuum are prone to breakdown across surfaces (flashover) at voltages which are much lower than are required to cause breakdown through the material itself. Treatments which deposit a small amount of metal on these surfaces, whether fired in place (as on a ceramic insulator) or vacuum deposited (as on a polymeric insulator) improve flashover performance: that is, the voltage at which flashover occurs increases. The system of FIG. 1 uses a commercially-available ion-implantation accelerator 100 to treat the insulator 110 by exposing it to a beam of high energy metal ions 120. The energy of the incident ions determines the penetration depth, while the time the material is exposed to the beam determines the concentration of metal atoms per unit area near the surface. Penetration depths of up to 100 atomic diameters may be achieved, as may concentrations of up to $5 \times 10^{17}$ particles/cm$^2$. Using a high-current accelerator with a current of up to 100 microamperes (equivalent to a particle flux of approximately $5 \times 10^{14}$ particles/second), even this maximum concentration may be achieved by an exposure time on the order of a few minutes per square centimeter of the insulator surface. The insulator 110 of FIG. 1 may be made of any of the materials currently used as a high-voltage insulator including: quartz, ceramics, and polymeric insulators.

Ion-bombardment of the insulator provides a finished quasi-metalized surface on the insulator. This has the same effect as other treatments which deposit a small amount of metal on these surfaces, whether fired in place (as on a ceramic insulator) or vacuum deposited (as on a polymeric insulator), namely, to improve flashover performance. Flashover performance is defined in terms of the voltage at which flashover occurs. When this voltage level is increased, the flashover performance is enhanced.

Figure 2:
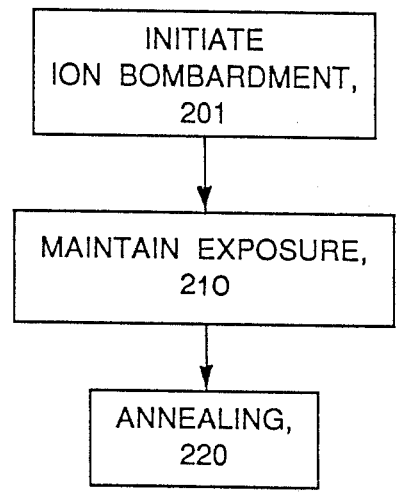
FIG. 2 is an illustration of the process of the present invention.

The reader's attention is now directed towards FIG. 2, which is a block diagram of the process of the present invention. The process begins with the initiation of ion-bombardment of the insulator 201 in the manner discussed above in the description of FIG. 1. This exposure is maintained 210 for an exposure time of a few minutes per square centimeter of insulated surface while bombarding the insulator with doses of up to $5 \times 10^{17}$ particles per cm$^2$. Finally, after the ion-bombardment is terminated, the quasi-metalized surface is finished by annealing 220 the insulator by heating it in an oven to conventional annealing temperatures.

Although this technique may be applied to various types of insulator materials, it is particularly advantageous when applied to polymers. Polymers are the material of choice in many practical insulator application, because of their superior mechanical properties and their availability in large sizes. Metalizing techniques which have been used on ceramic insulators are unsuitable for polymers, because these are high-temperature processes. Vapor deposition of metal has been accomplished on polymeric insulators, but the result is a surface coating which is vulnerable to mechanical damage during handling and use, and to damage from tracking should flashover occur. By making the metal a part of the structure of the insulator near the surface, the ion bombardment process yields a surface which has the same electrical properties as a metalized or vapor-deposited surface, with the additional advantage of mechanical and electrical ruggedness.

The method taught herein for treating high voltage insulators to improve the ability of the insulators to resist surface flashover may be applied to treatments of a wide variety of insulator materials, such as polymers, ceramics, glasses, metal oxides, and fiber/epoxy laminates, although it has particular utility in the treatment of polymers such as polyethylene, polystyrene, polymethylmethacrylate, polytetrafluoroethylene, polyvinylchloride, polycaprolactam and other polyamides, and acetal resins, used as high voltage insulators in vacuum. In practicing the invention, a surface of the insulator material to be treated is bombarded with a stream of high energy metal ions in order to penetrate the insulator surface to preselected depth and metal ion concentration. The metallic ions with which the insulator surface is bombarded in order to achieve an intended metallized surface layer on the insulator material may include iron, copper, nickel, aluminum, silver, gold, cobalt or other metals as would occur to one with skill in the applicable art guided by these teachings. The metal ion stream may be generated by commercially available accelerators, such as the model 400-10A ion implanter manufactured by Varian Associates, Inc., of Palo Alto, California, or the series 1080 universal ion accelerator manufactured by Danfysik of Jyllinge, Denmark. The energy of the incident beam of metal ions is selected to achieve penetration depths in the insulator surface of from about 0.1 to 1 micron, and time of exposure of the insulator surface to the beam may be selected in order to achieve the desired population density in the affected layer of the insulator material. In addition to the ion bombardment, the insulator surface may be annealed at a suitable temperature corresponding to the particular insulator material in order to optimize the ability of the material surface to resist flashover. The insulator surface may be cleaned conventionally or otherwise conditioned, if necessary, prior to metallic ion bombardment in order to promote uniform ion penetration into the insulator surface.

Treatment of an insulator surface according to the invention results in a quasi-metallized insulator surface having an improved ability to resist flashover. Particle accelerators are commonly available that can provide currents of up to 100 microamperes (equivalent to a particle flux of approximately $5 \times 10^{14}$ particles per second). Surface concentrations of up to $5 \times 10^{17}$ particles per square centimeter can be achieved routinely. Penetration depths of metals into polymers can be calculated from principles of atomic and nuclear physics by the skilled artisan in practicing the invention. TABLE I presents representative parameters for surface treatment of typical polymeric insulator materials.

TABLE I

| Metal Ion | Insulator Material | Voltage (Kilovolts) | Penetration Depth (microns) |
| --- | --- | --- | --- |
| Fe | Acetal Resin | 30 | 0.034 |
|  |  | 100 | 0.097 |
|  |  | 300 | 0.294 |
| Co | Polycaprolactam | 30 | 0.039 |
|  |  | 100 | 0.111 |
|  |  | 300 | 0.333 |
| Ni | Polytetrafluoroethylene | 30 | 0.027 |
|  |  | 100 | 0.075 |
|  |  | 300 | 0.231 |
| Ag | Polyethylene | 30 | 0.038 |
|  |  | 100 | 0.090 |
|  |  | 300 | 0.227 |
| Al | Polymethylmethacrylate | 30 | 0.064 |
|  |  | 100 | 0.032 |
|  |  | 300 | 0.682 |
| Au | Polystyrene | 30 | 0.032 |
|  |  | 100 | 0.067 |
|  |  | 300 | 0.145 |
| Cu | Polyvinylchloride | 30 | 0.029 |
|  |  | 100 | 0.082 |
|  |  | 300 | 0.241 |

The invention therefore provides an improved method for treating insulator surfaces to reduce flashover susceptibility thereof.

While the invention has been described in its presently preferred embodiment it is understood that the words which have been used are words of description rather than words of limitation and that changes within the purview of the appended claims may be made without departing from the scope and spirit of the invention in its broader aspects.

What is claimed is:

1. A process for treating high-voltage insulators in order to improve their flashover strength, said process comprising the steps of:
    exposing the high-voltage insulators to a beam of high-energy metal ions which are emitted by an ion accelerator;
    maintaining the beam of high-energy metal ions on the high-voltage insulator with a particle flux of up to approximately $5 \times 10^{14}$ particles per second for a preselected duration; and
    annealing the high-voltage insulators when said maintaining step is completed.

2. A process of treating high-voltage insulators in order to improve their flashover strength, said process comprising exposing the high-voltage insulators to a beam of high-energy metal ions which are emitted by an ion accelerator.

3. A process of treating high-voltage insulators, as defined in claim 2, wherein said metal ions are generated using a source of metallic ions of a metal selected from the group consisting of iron, cobalt, nickel, silver, aluminum, gold and copper.

4. A process for treating high-voltage insulators, as defined in claim 3, wherein said high-voltage insulators are selected from a group consisting of polymers, ceramics, glasses, metal oxides, and fiber/epoxy laminates.

5. A process for treating high-voltage insulators, as defined in claim 4, wherein said exposing step includes directing said beam of high-energy metal ions onto a surface of an insulator for preselected time to achieve preselected depth of penetration and metallic ion density of said high-energy metal ions in the insulator surface.

6. A process of treating high-voltage insulators, as defined in claim 4, wherein said process includes annealing the high voltage insulators.

7. A process for treating high-voltage insulators, as defined in claim 3, wherein said process includes directing said beam of high energy metal ions onto a surface of an insulator for preselected time to achieve preselected depth of penetration and metallic ion density of said high-energy ions in the insulator surface.

8. A process for treating high-voltage insulators, as defined in claim 3, wherein said process includes annealing the high-voltage insulators.

9. A process for treating high-voltage insulators, as defined in claim 3, wherein said process includes maintaining the beam of high-energy metal ions on the high-voltage insulator with a particle flux of up to approximately $5 \times 10^{14}$ particles per second for a preselected duration.

10. A process for treating high-voltage insulators in order to improve their flashover strength, said process comprising the steps of:
    exposing the high-voltage insulators to a beam of high-energy metal ions which are emitted by an ion accelerator; and
    maintaining the beam of high-energy metal ions on the high-voltage insulator with a particle flux of up to approximately $5 \times 10^{14}$ particles per second for a preselected duration.

11. A process of treating high-voltage insulators, as defined in claim 10, wherein said metal ions are generated using a source of metallic ions of a metal selected from the group consisting of iron, cobalt, nickel, silver, aluminum, gold and copper.

12. A process for treating high-voltage insulators, as defined in claim 11, wherein said high-voltage insulators are selected from a group consisting of polymers, ceramics, glasses, metal oxides, and fiber/epoxy laminates.

13. A process for treating high-voltage insulators, as defined in claim 12, wherein said exposing step includes directing said beam of high-energy metal ions onto a surface of an insulator for preselected time to achieve preselected depth of penetration and metallic ion density of said high-energy metal ions in the insulator surface.

14. A process for treating high-voltage insulators, as defined in claim 13, wherein said maintaining step is continued until surface concentration of said metal ions is said insulator of up to approximately $5 \times 10^{17}$ particles per square centimeter are achieved.

15. A process for treating high-voltage insulators, as defined in claim 14 wherein said polymers selected for said high-voltage insulators include acetal resin, polycaprolactam, polytetinfluoro-ethylene, polyethylene, polyvinylchoride, and polystyrene.

* * * * *